US012055962B2

(12) United States Patent
Golara et al.

(10) Patent No.: US 12,055,962 B2
(45) Date of Patent: Aug. 6, 2024

(54) LOW-VOLTAGE POWER SUPPLY REFERENCE GENERATOR CIRCUIT

(71) Applicant: Apple Inc., Cupertino, CA (US)

(72) Inventors: Soheil Golara, San Jose, CA (US); Seyedeh Sedigheh Hashemi, Santa Clara, CA (US); Mansour Keramat, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 243 days.

(21) Appl. No.: 17/508,016

(22) Filed: Oct. 22, 2021

(65) Prior Publication Data

US 2023/0083084 A1  Mar. 16, 2023

Related U.S. Application Data

(60) Provisional application No. 63/240,691, filed on Sep. 3, 2021.

(51) Int. Cl.
  *G05F 1/46*  (2006.01)
  *G05F 3/26*  (2006.01)
  *G11C 5/14*  (2006.01)

(52) U.S. Cl.
  CPC .............. *G05F 1/468* (2013.01); *G05F 3/262* (2013.01); *G11C 5/147* (2013.01)

(58) Field of Classification Search
  CPC ......... G05F 1/468; G05F 3/262; G11C 5/147; G11C 7/04; G11C 29/021; G11C 29/028
  See application file for complete search history.

(56) References Cited

U.S. PATENT DOCUMENTS

| 5,197,033 | A | * | 3/1993 | Watanabe | ............ | H03K 19/017 |
|---|---|---|---|---|---|---|
| | | | | | | 365/189.09 |
| 5,883,544 | A | | 3/1999 | So et al. | | |
| 7,495,507 | B2 | | 2/2009 | Choi | | |
| 9,935,626 | B2 | * | 4/2018 | Gariboldi | ............. | H03K 17/167 |
| 2001/0011886 | A1 | * | 8/2001 | Kobayashi | .............. | G05F 1/465 |
| | | | | | | 323/281 |
| 2014/0062452 | A1 | * | 3/2014 | Ok | ........................... | G05F 3/16 |
| | | | | | | 323/313 |
| 2019/0277800 | A1 | * | 9/2019 | Chung | ............... | G01N 27/4145 |
| 2020/0209906 | A1 | | 7/2020 | Choi et al. | | |

FOREIGN PATENT DOCUMENTS

JP          2007148530 A     6/2007

* cited by examiner

*Primary Examiner* — Sultana Begum
(74) *Attorney, Agent, or Firm* — Kowert, Hood, Munyon, Rankin & Goetzel, P.C.; Dean M. Munyon

(57) ABSTRACT

A reference generator circuit included in a computer system may employ multiple field-effect transistors to generate a reference voltage whose value is based on the threshold voltages of the multiple field-effect transistors. The reference generator circuit can include a current source that generates a bias current. One of more stages included in the reference generator circuit can generate, using the bias current, respective output voltages whose values are based on differences in threshold voltages of field-effect transistors included in the stages. The output voltages can be combined to generate different reference voltage values.

20 Claims, 13 Drawing Sheets

LOW-VOLTAGE POWER SUPPLY REFERENCE GENERATOR CIRCUIT

PRIORITY INFORMATION

This application claims the benefit of U.S. Provisional Application No. 63/240,691, filed on Sep. 3, 2021, which is incorporated by reference herein in its entirety.

BACKGROUND

Technical Field

This disclosure relates to analog circuits in computer systems and, more particularly, to the generation of reference voltages.

Description of the Related Art

Modern computer systems may include multiple circuits blocks designed to perform various functions. For example, such circuit blocks may include processors, or processor cores configured to execute software or program instructions. Additionally, the circuit blocks may include memory circuits, mixed-signal or analog circuits, and the like.

In some computer systems, some of the circuit blocks may require a reference voltage for operation. For example, voltage regulator or power converter circuits may employ reference voltages as part of control loops. In some computer systems, analog-to-digital converter circuits may use multiple reference voltages in converting an analog signal to multiple bits.

During operation, the value of a reference voltage needs to remain within a threshold of a target value despite changes in the voltage level of a power supply. In some cases, a reference voltage may additionally need to remain within the threshold of the target value across a range of temperatures, or have a known variation with temperature.

SUMMARY OF THE EMBODIMENTS

Various embodiments for generating a reference voltage level are disclosed. Broadly speaking, a reference generator circuit includes a current source configured to generate a bias current using an input power supply. The reference generator circuit also includes a plurality of devices including a first field-effect transistor with a first threshold voltage, and a second field-effect transistor with a second threshold voltage. The plurality of devices are configured to generate, using the bias current, a reference voltage whose value is based on a first difference between the first threshold voltage and the second threshold voltage. In some cases, a first ratio of a width of the first field-effect transistor to a length of the first field-effect transistor is the same as a second ratio of a width of the second field-effect transistor to a length of the second field-effect transistor.

DETAILED DESCRIPTION OF EMBODIMENTS

Figure 1:
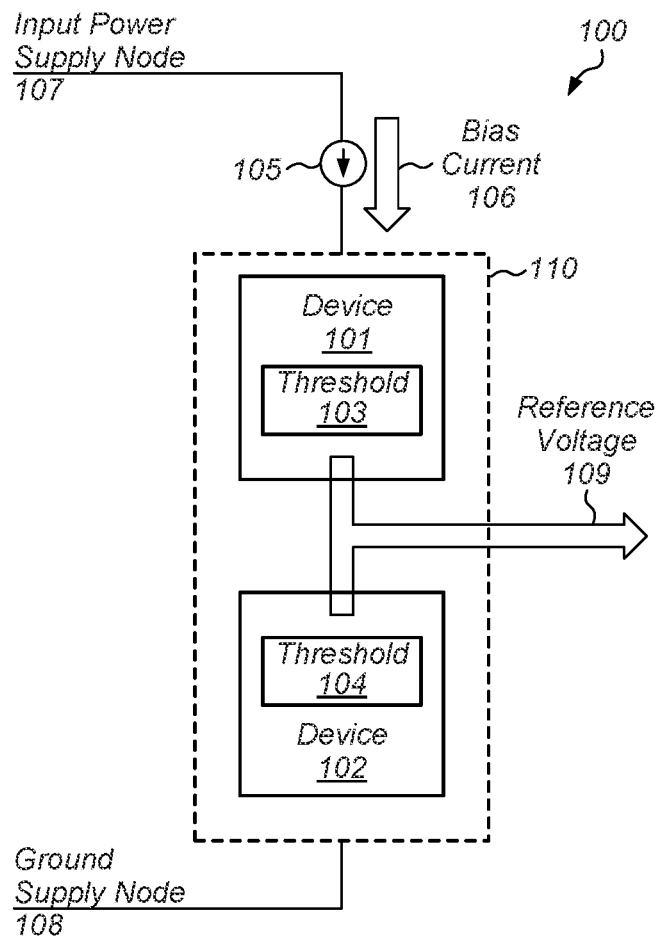
FIG. 1 is a block diagram of an embodiment of a reference generator circuit for a computer system.

Computer systems may include multiple circuit blocks configured to perform specific functions. Such circuit blocks may include analog, mixed-signal, and radio-frequency (RF) circuits. Such circuits may include power detection circuits, performance monitoring circuits, temperature sensor circuits, power converter circuits, voltage regulator circuits, and the like.

Many analog, mixed-signal, and RF circuits rely upon precision voltage reference circuits that generate reference voltages that vary little with respect to operational parameters (e.g., supply voltage level, temperature, etc.) of the reference circuit. Such precision circuits often rely on band gap circuits, which create a voltage level that is based on the band gap of silicon, providing the needed precision and stability.

Band gap circuits, however, need a sufficiently large input power supply in order to provide enough operating margin. Moreover, a power supply for a band gap circuit needs to be low noise, which can add costly analog supply pins or voltage regulators to a computer system. Band gap circuits typically rely on bipolar devices, which are becoming increasingly difficult to fabricate on modern integrated circuits. The embodiments illustrated in the drawings and described below may provide techniques for generating a reference voltage that does not rely on bipolar devices, but rather, the threshold voltages of field-effect transistors, allowing for the use of low-voltage digital power supplies within an integrated circuit.

A block diagram depicting an embodiment of a reference generator circuit is depicted in FIG. 1. As illustrated, reference generator circuit 100 includes current source 105, and devices 110.

Current source 105 is coupled to input power supply node 107 and is configured to generate bias current 106, which is sourced to devices 110. In various embodiments, current source 105 may be implemented as part of a current mirror circuit, or any other suitable circuit configured to generate a constant current.

Devices 110 is coupled between input power supply node 107 and ground supply node 108, and includes device 101 with threshold voltage 103, and device 102 with threshold voltage 104. Devices 110 are, in various embodiments, configured to generate, using bias current 106, reference voltage 109. In some embodiments, a value of reference voltage 109 is based on a difference between threshold voltage 103 and threshold voltage 104.

In various embodiments, device 101 and device 102 may be implemented as field-effect transistors. As used and described herein, a field-effect transistor (referred to as a "FET") is a type of transistor that uses an electric field to control the flow of current in an integrated circuit. In various embodiments, FETs have three terminals denoted as "source," "gate," and "drain."

In response to an application of a voltage to the gate terminal, a FET alters the conductivity between the drain and source terminals, thereby changing the flow of current between the two terminals. It is noted that the voltage applied to the gate must exceed a particular value (referred to as a "threshold voltage") in order to allow any conduction between the drain and source terminals. The conduction between the drain and source terminals generally increases in response to an increase in the voltage level applied to the gate. Depending on a type of majority carrier that conducts current between the source and drain terminals, the polarity of voltage level applied to the gate may be different relative to the threshold voltage.

Various types of technologies can be used to fabricate a FET. For example, in some embodiments, a FET may employ a depletion layer between the gate and the source/drain region creating what is referred to as a junction field-effect transistor or "JFET." Other types of FETs can include metal-oxide semiconductor field-effect transistors ("MOSFETs"), fin field-effect transistors ("FinFETs"), gate-all-around field-effect transistors ("GAAFETs"), and the like.

As described below, certain physical characteristics (e.g., width and length) of devices 101 and 102 may be designed to aid in the generation of reference voltage 109. In some embodiments, devices 110 may be further configured to modify a temperature dependence of reference voltage 109 by adjusting a particular physical characteristic (e.g., width) of device 101.

It is noted that in some embodiments, current source 105 may be further configured to adjust a value of bias current 106 to compensate for differences in a voltage level of input power supply node 107. In some embodiments, reference generator circuit 100 may include a trim circuit configured to adjust the value of reference voltage 109. By including a trim circuit, reference generator circuit 100 can compensate for changes from one integrated circuit to another due to manufacturing variation.

Figure 2:
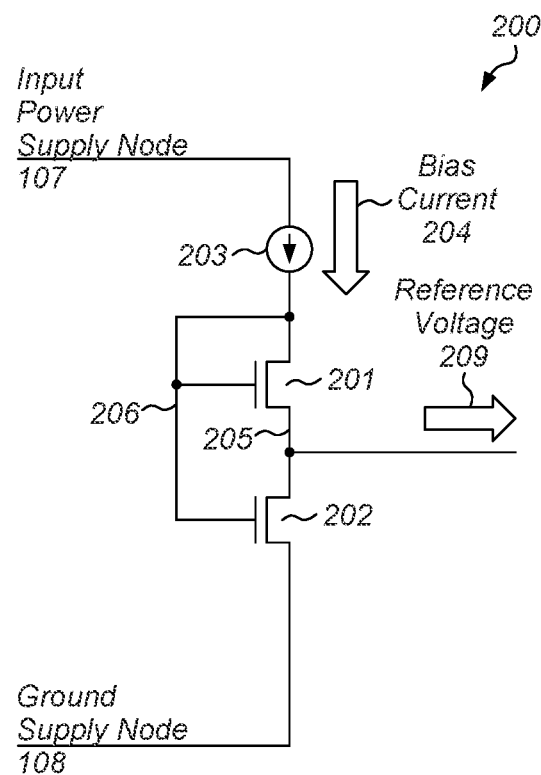
FIG. 2 is a block diagram of an embodiment of a delta-threshold circuit.

Turning to FIG. 2, a block diagram an embodiment of a delta-threshold circuit is depicted. As illustrated, delta-threshold circuit 200 includes devices 201 and 202, and current source 203. In some cases, delta-threshold circuit 200 may correspond to reference generator circuit 100. It is noted that delta-threshold circuit 200 may be used in a standalone fashion, such as reference generator circuit 100 or, as described below, may be cascaded, i.e., coupled in series, with other delta-threshold circuits to generate different values for a reference voltage.

Current source 203 is coupled between input power supply node 107 and node 206, and is configured to generate bias current 204. In various embodiments, current source 203 may be implemented as part of a current mirror circuit, or any other suitable circuit configured to generate a constant current.

Device 201 is coupled between nodes 205 and 206, and is controlled by a voltage level of node 206. In a similar fashion, device 202 is coupled between node 205 and ground supply node 108, and is controlled by the voltage level of node 206. In various embodiments, devices 201 and 202 may be implemented as n-channel MOSFETs, FinFETs, GAAFETs, or any other suitable transconductance device. It is noted that the respective threshold voltages of devices 201 and 202 are different. For example, device 201 may be implemented as a low-threshold device, while device 202 may be implemented as a standard-threshold device.

As illustrated, reference voltage 209 is the voltage level of node 205, which is the difference between the gate-to-source voltages of device 201 and device 202 as depicted in Equation 1, where $V_{ref}$ is reference voltage 209, and $V_{GS(201)}$ is the gate-to-source voltage of device 201, and $V_{GS(202)}$ is the gate-to-source voltage of device 202.

$$V_{ref} = V_{GS(201)} - V_{GS(202)} \quad (1)$$

Since both device 201 and device 202 are coupled together in series, and there is negligible current into any load circuits connected to node 205, the respective drain-to-source currents of devices 201 and 202 are the same as depicted in Equation 2, where $u_n$ is electron mobility, $C_{ox}$ is the capacitance of the oxide in devices 201 and 202, W is the width of devices 201 and 202, L is the channel length of devices 201 and 202, $V_{GS}$ is the gate-to-source voltages of either device 201 or device 202, $V_{th}$ is the respective threshold voltages of devices 201 and 202, λ is the channel-length modulation parameter, and $V_{DS}$ is the respective drain-to-source voltages of devices 201 and 202.

$$I_{DS} = \frac{1}{2} u_n C_{OX} \frac{W}{L} (V_{GS} - V_{th})^2 (1 + \lambda V_{DS}) \quad (2)$$

Solving for the gate-to-source voltages ($V_{GS}$) for both device 201 and 202, and substituting into Equation 1, the voltage for reference voltage 209 can be reduced to a difference between the threshold values for devices 201 and 202 as depicted in Equation 3, where $V_{th(201)}$ is the threshold voltage for device 201 and $V_{th(202)}$ is the threshold voltage for device 202. It is noted that Equation 3 assumes that channel-length modulation effects are negligible. In various embodiments, devices 201 and 202 may be designed to use long-channel lengths to minimize channel-length modulation effects. Additionally, Equation 3 also assumes that the beta ratios for devices 201 and 202 are the same. As used and defined herein, the beta ratio for a field-effect transistor is a ratio of the field-effect transistor's width to its length.

$$V_{ref} \approx V_{th(201)} - V_{th(202)} \quad (3)$$

It is noted that although the delta-threshold circuit 200 is depicted as using n-channel field-effect transistors, in other embodiments, p-channel field-effect transistors could be employed.

Figure 3:
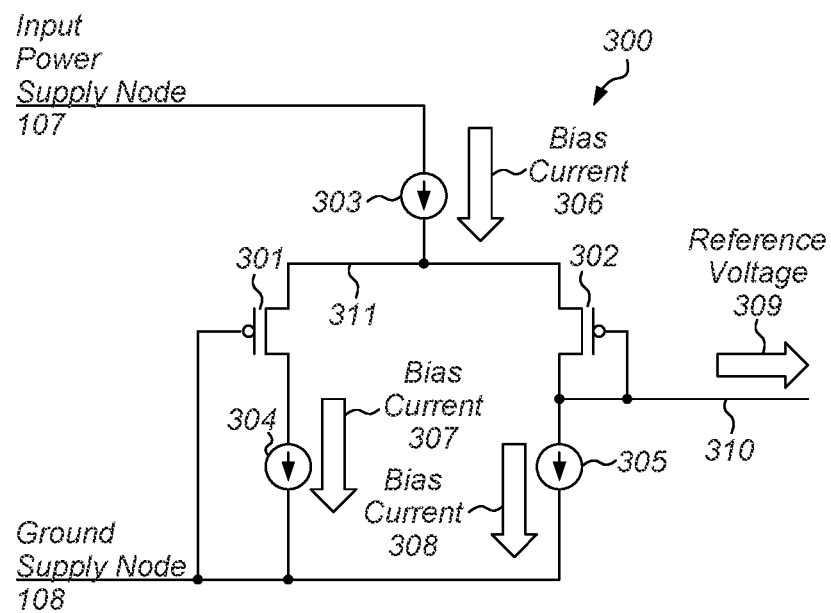
FIG. 3 is a block diagram of another embodiment of a delta-threshold circuit.

Turning to FIG. 3, a different embodiment of a delta-threshold circuit is depicted. As illustrated, delta-threshold circuit 300 includes devices 301 and 302, and current sources 303-305. It is noted that delta-threshold circuit 300 may be used in a standalone fashion and may correspond to reference generator circuit 100. Alternatively, as described below, delta-threshold circuit 300 may be used in conjunction with other delta-threshold circuits to generate reference voltages of various values.

Current source 303 is coupled between input power supply node 107 and node 311, and is configured to source bias current 306 to node 311. Current source 304 is coupled between device 301 and ground supply node 108, while current source 305 is coupled between node 310 and ground supply node 108. Current source 304 is configured to sink bias current 307 from device 301 into ground supply node 108, and current source 305 is configured to sink bias current 308 from device 302 into ground supply node 108. It is noted that the value of bias current 306 may be twice the value of either bias current 307 or bias current 308.

In various embodiments, current sources 303-305 may each be implemented as part of a current mirror circuit, or any other suitable circuit configured to generate a constant current. It is noted that in some embodiments, current sources 303-305 may share portions of a common current source circuit. For example, current source 304 and current source 305 may each be implemented as devices included in a common current mirror circuit.

Device 301 is coupled between node 311 and current source 304. A control terminal of device 301 is coupled to ground supply node 108. Device 302 is coupled between node 311 and 310, and a control terminal of device 302 is also coupled to node 310. In various embodiments, devices 301 and 302 may be implemented as p-channel MOSFETs, FinFETs, GAAFETs, or any other suitable transconductance device. It is noted that the respective threshold voltages of devices 301 and 302 are different. For example, device 301 may be implemented as a low-threshold device, while device 302 may be implemented as a standard-threshold device.

Devices 301 and 302 form a differential pair. Since the threshold voltages for the two devices are different, the differential pair is said to be "skewed." Since current sources 304 and 305 force the currents flowing in devices 301 and 302 to be the same, and since the gate voltage of device 301 is at or near ground potential, the voltage level of node 310 will settle at a voltage that maintains this equilibrium. In this case, the voltage of node 310, which corresponds to reference voltage 309, settles to a value that is the difference between the threshold voltage of device 301 and the threshold voltage of device 302.

Figure 4:
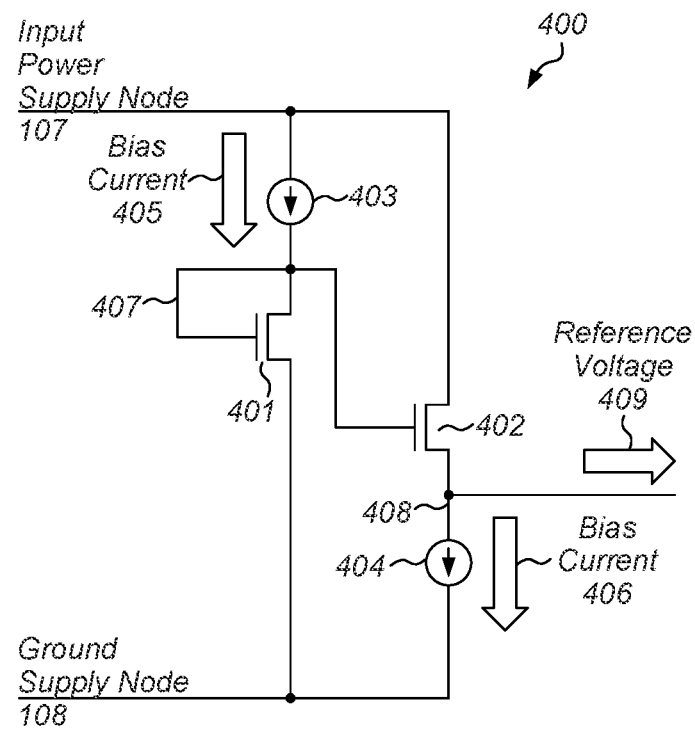
FIG. 4 is a block diagram of a different embodiment of delta-threshold circuit.

Turning to FIG. 4, another embodiment of a delta-threshold circuit is depicted. As illustrated, delta-threshold circuit 400 includes devices 401 and 402, and current sources 403 and 404. It is noted that delta-threshold circuit 400 may be used in a standalone fashion and may correspond to reference generator circuit 100. Alternatively, as described below, delta-threshold circuit 400 may be used in conjunction with other delta-threshold circuits to generate reference voltages of various values.

Current source 403 is coupled between input power supply node 107 and node 407, and is configured to generate bias current 405. Current source 404 is coupled between node 408 and ground supply node 108, and is configured to generate bias current 406. It is noted that, in some embodiments, the values of bias current 405 and 406 may be the same. In various embodiments, current sources 403 and 404 may be implemented as part of current mirror circuits, or any other suitable circuits configured to generate constant currents. It is further noted that although devices 401 and 402 are depicted as being single field-effect transistors, in other embodiments, devices 401 and 402 may include multiple field-effect transistors coupled together in parallel.

Device 401 is coupled between node 407 and ground supply node 108, and is controlled by a voltage level of node 407. Device 402 is coupled between input power supply node 107 and node 408, and is controlled by the voltage level of node 407. In various embodiments, devices 401 and 402 may be implemented as n-channel MOSFETs, FinFETs, GAAFETs, or any other suitable transconductance device. It is noted that the respective threshold voltages of devices 401 and 402 are different. For example, device 401 may be implemented as a low-threshold device, while device 402 may be implemented as a standard-threshold device.

Reference voltage 409 is a sum of the gate-to-source voltage of device 402 and the gate-to-source voltage of device 401. Since the currents flowing through devices 401 and 402 are the same due to current sources 403 and 404, respectively, reference voltage 409 becomes the difference between the threshold voltage of device 401 and the threshold voltage of device 402, in a similar fashion to what is described above in regard to the embodiment of FIG. 2.

As described above, the temperature response of the reference voltages generated by the various embodiments of the delta-threshold circuits is essentially flat, i.e., as temperature increases or decreases, the respective values of the reference voltages remain the same.

In some cases, however, it may be desirable for a reference voltage to have a non-zero response to temperature. For example, if a circuit that uses the reference voltage has a positive temperature response, providing a reference voltage with a negative temperature response may be used to cancel the positive temperature response so that the circuit can operate independently of temperature.

Figure 5:
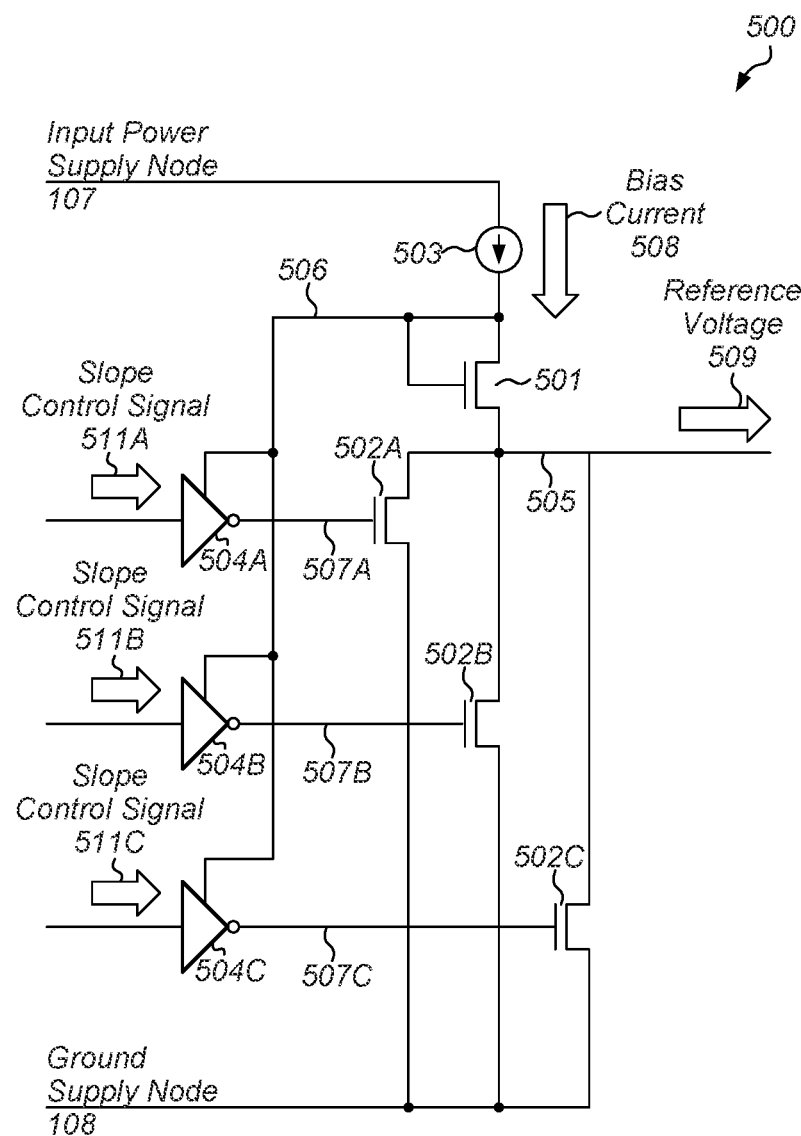
FIG. 5 is a block diagram of an embodiment of a delta-threshold circuit with temperature slope control.

A block diagram of an embodiment of a delta-threshold circuit whose temperature response can be modified is depicted in FIG. 5. As illustrated, delta-threshold circuit 500 includes devices 501 and 502A-C, current source 503, and inverters 504A-C. It is noted that although only three device-inverter pairs are depicted in the embodiment of FIG. 5, in other embodiments, any suitable number of device-inverter pairs may be employed.

Current source 503 is coupled between input power supply node 107 and node 506, and is configured to generate bias current 508. In various embodiments, current source 503 may be implemented as part of a current mirror circuit, or any other suitable circuit configured to generate a constant current.

Device 501 is coupled between node 506 and node 505, and is controlled by a voltage level of node 506. Devices 502A-C are coupled between node 506 and ground supply node 108, and are controlled by voltage levels of node 507A-C, respectively. In various embodiments, devices 501 and 502A-C may be implemented as n-channel MOSFETs, FinFETs, GAAFETs, or any other suitable transconductance device. It is noted that the respective threshold voltages of devices 501 and 502A-C are different. For example, device 501 may be implemented as a low-threshold device, while devices 502A-C may be implemented as standard-threshold devices.

An output of inverter 504A is coupled to node 507A, and is configured to generate a voltage level on node 507A using slope control signal 511A. In a similar fashion, inverters 504B and 504C are coupled to node 507B and 507C, respectively. Power terminals for each of inverters 504A-504C are coupled to node 506.

Delta-threshold circuit 500 operates in a similar fashion to that described above in regard to the embodiment of FIG. 2, with a value of reference voltage 509 being based on a difference between the threshold voltage of device 501 and active ones of devices 502A-C. Different ones of devices 502A-C can be activated by changing the values of slope control signals 511A-C. For example, in response to a determination that slope control signal 511A is at a low-logic level, inverter 504A generates a voltage on node 507A equal to the voltage level of node 506, partially activating device 502A in a fashion similar to the embodiment of FIG. 2. Alternatively, in response to a determination that slow control signal 511A is at high-logic level, inverter 504A generates a voltage level on node 507A at or near ground potential, de-activating device 502A.

As used and defined herein, a low-logic level is a voltage level that is sufficient to activate a p-channel field-effect transistor and de-activate an n-channel field-effect transistor, and a high-logic level is a voltage level that is sufficient to de-activate a p-channel field-effect transistor and activate an n-channel field-effect transistor.

Inverters 504A-C may, in various embodiments, be implemented as complementary metal-oxide semiconductor (CMOS) inverters that include at least one p-channel field-effect transistor and at least one n-channel field-effect transistor. In other embodiments, different types of inverting amplifier circuits may be employed, including those that use technology other than CMOS.

In a similar fashion, devices 502B and 502C can be activated or de-activated. By adjusting which of devices 502A-C are active, a mismatch in the beta ratio of device 501 and a combined beta ratio of devices 502A-C can be introduced. With such a mismatch, reference voltage 509 is no longer temperature independent. The direction of the dependency may, in various embodiments, be based on the number of devices 502A— C that are active, as well as the threshold value of device 501 relative to the threshold values of devices 502A-C.

Figure 6:
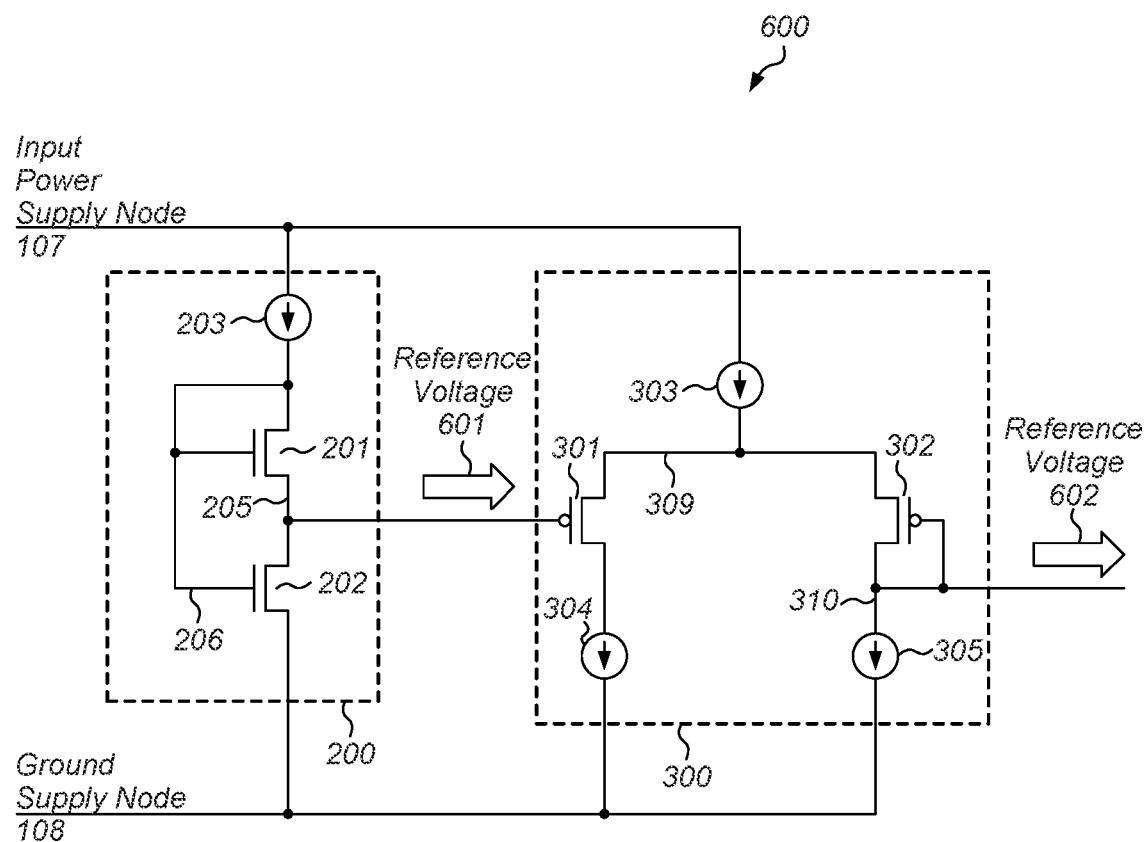
FIG. 6 is a block diagram of an embodiment of a reference core circuit.

While a reference voltage whose value is a difference between two field-effect transistor thresholds may be useful in many applications, there may be other situations where larger reference voltages may be needed. In such cases, multiple delta-threshold circuits may be coupled together in a serial fashion (referred to as a "cascade") to generate larger reference voltage values. A block diagram of an embodiment of a reference core circuit that employs a cascade of delta-threshold circuits is depicted in FIG. 6. As illustrated, reference core 600 includes delta-threshold circuit 200 and delta-threshold circuit 300. It is noted that although only two delta-threshold circuits are depicted in the embodiment of FIG. 6, in other embodiments, more than two delta-threshold circuits may be cascaded together.

Delta-threshold circuit 200 is coupled to input power supply node 107 and ground supply node 108. As described above, delta-threshold circuit 200 is configured to generate reference voltage 601 such that a value of reference voltage 601 corresponds to a difference between the threshold voltages of devices 201 and 202.

Delta-threshold circuit 300 is also coupled between input power supply node 107 and ground supply node 108, and is configured to generate reference voltage 602. As described above in regard to FIG. 3, a value of reference voltage 602 is based on a difference between the threshold voltages of devices 301 and 302. In this case, however, the control terminal of device 301 is coupled to node 205 of delta-threshold circuit 200 such that device 301 is controlled by reference voltage 601. With device 301 being controlled by reference voltage 601, delta-threshold circuit 300 is configured to generate reference voltage 602 such that the value of reference voltage 602 is a sum of the difference of the threshold voltages of devices 201 and 202, and the difference of the threshold voltages of devices 301 and 302, thereby creating a reference voltage whose value is greater than what can be generated by either of delta-threshold circuit 200 or delta-threshold circuit 300.

During the manufacture of integrated circuits, differences in lithography, dopant implant levels, and the like, can result in small changes in the electrical properties of field-effect transistors from one integrated circuit to another. Such changes can result in a reference generator circuit, such as reference generator circuit 100, generating different values for a reference voltage from one integrated circuit to another. While the changes may be small (e.g., less than a millivolt), they may affect the performance of circuits that use the reference voltage.

Figure 7:
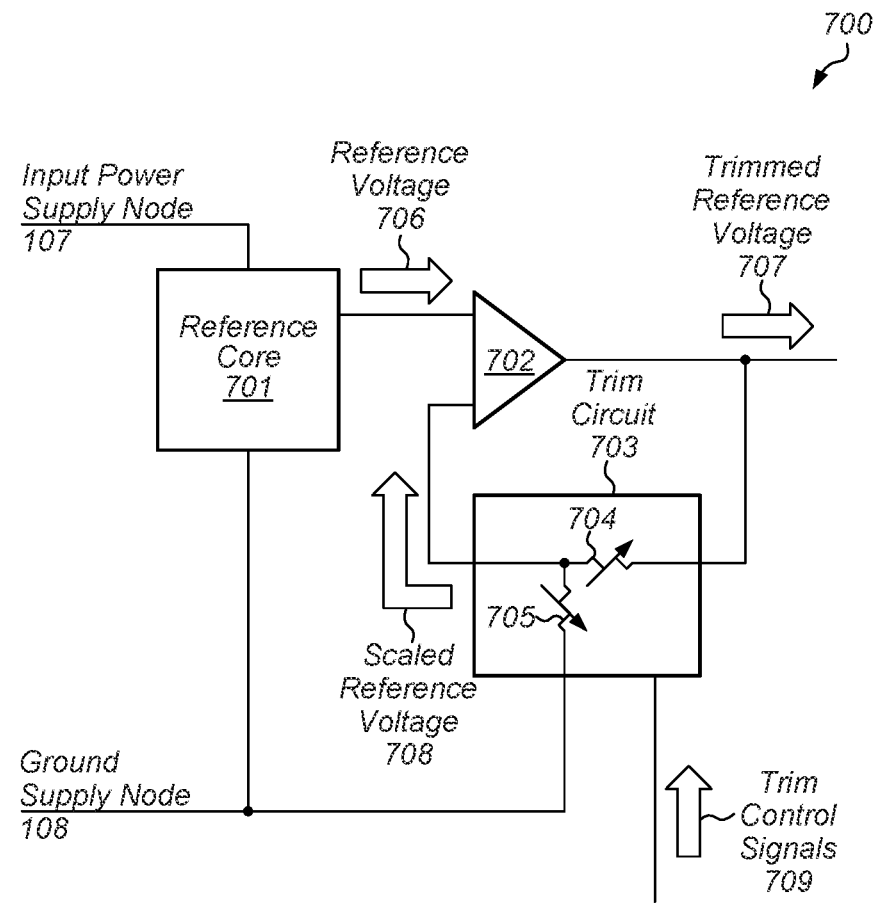
FIG. 7 is a block diagram of an embodiment of a reference generator circuit with trim capability.

To address such variation, a reference generator circuit can be adjusted or "trimmed" after the manufacturing process has been completed based on measured characteristics. A block diagram of an embodiment of a reference generator circuit that can be trimmed is depicted in FIG. 7. As illustrated, reference generator circuit 700 includes reference core 701, buffer circuit 702, and trim circuit 703.

Reference core 701 is coupled to input power supply node 107 and ground supply node 108, and is configured to generate reference voltage 706 using a voltage level of input power supply node 107. In various embodiments, reference core 701 may correspond to reference core 600 as depicted in FIG. 6, and may include multiple delta-threshold circuits coupled together in series.

Buffer circuit 702 is configured to generate trimmed reference voltage 707 using reference voltage 706 and scaled reference voltage 708. In various embodiments, to generate trimmed reference voltage 707, buffer circuit 702 is further configured to compare reference voltage 706 and scaled reference voltage 708 to generate trimmed reference voltage 707. Buffer circuit 702 may, in some cases, be further configured to generate trimmed reference voltage 707 such that a value of trimmed reference voltage 707 is proportional to a difference of reference voltage 706 and scaled reference voltage 708. In various embodiments, buffer circuit 702 may be implemented as a differential amplifier circuit or any other suitable circuit configured to generate an output voltage whose value is based on a comparison of two or more input voltage levels.

Trim circuit 703 is configured to generate scaled reference voltage 708 using trimmed reference voltage 707. In various embodiments, trim circuit 703 includes resistors 704 and 705 arranged as a resistive voltage divider circuit, such that a value of trimmed reference voltage 707 is scaled as shown in Equation 4, where V scaled is the value of scale reference voltage 708, $R_{704}$ is the value of resistor 704, $R_{705}$ is the value of resistor 705, and $V_{trim}$ is the value of trimmed reference voltage 707.

$$V_{scaled} = \frac{R_{705}}{R_{704} + R_{705}} V_{trim} \tag{4}$$

The values of resistors 704 and 705 can be adjusted using trim control signals 709. In various embodiments, after manufacture, reference generator circuit 700 is tested and, based on results of the test, values are determined for resistors 704 and 705 in order to adjust the value of reference voltage 706 to its target value. Once the values of resistors 704 and 705 have been determined, one or more of trim control signals 709 are activated in order to set resistors 704 and 705 to their determined values. In various embodiments, trim control signals 709 may open or close multiple switches (not shown) that couple resistor elements together to form resistors 704 and 705 with their determined values. In some cases, the respective states of trim control signals 709 may be stored in a one-time programmable memory circuit, or any other suitable non-volatile memory circuit. In other embodiments, periodic calibration may be performed in the field, and new states determined for trim control signals 709 based on results of the calibration operation.

It is noted that the embodiment depicted in FIG. 7 is merely an example. In other embodiments, reference voltage 706 may be trimmed using other circuit techniques. For example, in some embodiments, respective widths of one or more field-effect transistors in reference core 701 may be adjusted in order to bring reference voltage 706 to a desired value.

Figure 8:
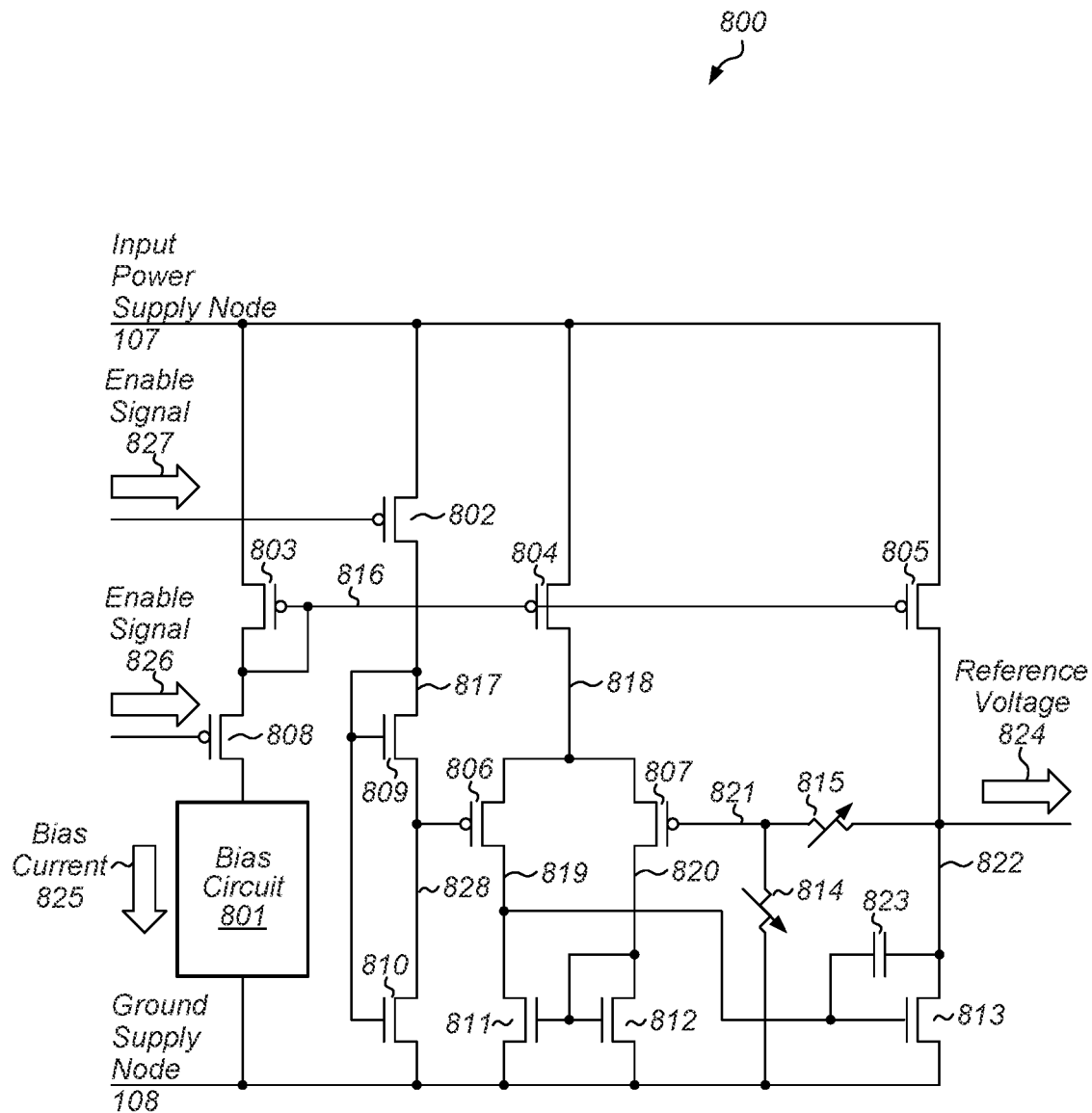
FIG. 8 is a block diagram of an embodiment of a reference generator circuit with adjustable bias current.

In cases where multiple delta-threshold circuits are employed to generate a reference voltage, some of the circuitry within the multiple delta-threshold circuits may be consolidated to reduce the overall size and power consumption of the reference generator circuit. A block diagram of such an embodiment of a reference generator circuit is depicted in FIG. 8. As illustrated, reference generator circuit 800 includes bias circuit 801, devices 802-813, resistors 814 and 815, and capacitor 823. In various embodiments, reference generator circuit 800 may correspond to reference core 600 or 701.

Bias circuit 801 is configured to sink bias current 825 from devices 803 and 808, when device 808 is active. As described below, bias circuit 801 may include multiple resistors and switch devices, and be further configured to adjust a value of bias current 825 based on one or more control signals.

Device 803 is coupled between input power supply node 107 and device 808, and is controlled by a voltage level of node 816. Device 808 is coupled between node 816 and bias circuit 801, and is controlled by enable signal 826. In various embodiments, device 808 may be configured, in response to an activation of enable signal 826, to couple device 803 to bias circuit 801 to allow the biasing network of reference generator circuit 800 to operate.

Device 804 is coupled between input power supply node 107 and node 818, and is controlled by the voltage level of node 816. In a similar fashion, device 805 is coupled between input power supply node 107 and node 822, and is controlled by the voltage level of node 816. In various embodiments, devices 804 and 805 form a current mirror circuit with device 803, such that the current flowing through device 803, i.e., bias current 825, is replicated in each of devices 804 and 805.

Device 802 is coupled between input power supply node 107 and node 817, and is controlled by enable signal 827. In various embodiments, device 802 is configured, in response to an activation of enable signal 827, to couple device 809 to input power supply node 107, allowing a current to flow through devices 809 and 810. Alternatively, enable signal 827 may be an analog voltage level that causes device 802 to act as a current source providing current to devices 809 and 810. In some embodiments, enable signal 827 may be omitted, and the control terminal of device 802 may be coupled to node 816, make device 802 part of the current mirror circuit formed by devices 803-805.

Device 809 is coupled between node 817 and node 828, while device 810 is coupled between node 828 and ground supply node 108. Both device 809 and device 810 are controlled by the voltage level of node 817. In various embodiments, devices 809 and 810 function in a similar fashion to devices 201 and 202, as described above in regard to FIG. 2, to generate a voltage level on node 828 that is based on a difference between the respective threshold voltages of device 809 and 810. It is noted that the threshold voltage of device 809 may be different than the threshold voltage of device 810.

Device 806 is coupled between node 818 and node 819, while device 807 is coupled between node 818 and node 820. Device 806 is controlled by the voltage level of node 828, and device 807 is controlled by the voltage level of node 821. In various embodiments, devices 806 and 807 are configured to function in a similar fashion to devices 301 and 302 of the embodiment depicted in FIG. 3. It is noted that since the control terminal of device 806 is coupled to node 828, devices 806 and 807 generate a voltage on node 819 that is based on the difference between the respective threshold voltages of device 806 and 807, in addition to the voltage level of node 828.

Device 811 is coupled between node 819 and ground supply node 108, and device 812 is coupled between node 820 and ground supply node 108. Both devices 811 and 812 are controlled by the voltage level of node 820. In various embodiments, devices 811 and 812 form a current mirror circuit, forcing the current flowing through devices 806 and 807 to be the same value.

Device 813 is coupled between node 822 and ground supply node 108. In various embodiments, device 813 is configured to sink a current from node 822 based on the voltage level of node 819, in order to generate reference voltage 824 on node 822. It is noted that the value of reference voltage 824 is based on a sum of a difference of the threshold voltages of devices 809 and 810, and a difference of the threshold voltages of device 806 and 807, in a similar fashion to that described above in regard to FIG. 6.

Devices 809-813 may, in various embodiments, be implemented as n-channel MOSFETs, FinFETs, GAAFETs, or any other suitable transconductance devices. Devices 802-809 may, in various embodiments, be implemented as p-channel MOSFETs, FinFETs, GAAFETs, or any other suitable transconductance devices.

Resistor 814 is coupled between node 821 and ground supply node 108, while resistor 815 is coupled between node 822 and node 821. In various embodiments, resistors 814 and 815 function as a resistive voltage divider configured to scale reference voltage 824, and couple the scaled voltage level onto the control terminal of device 807, in a fashion similar to that described above in regard to FIG. 7. It is noted that both resistor 814 and resistor 815 are variable, and their values may be selected based on an amount of adjustment needed for reference voltage 824. Resistors 814 and 815 may, in various embodiments, be implemented using polysilicon, metal, or any other suitable material available on semiconductor manufacturing process.

Capacitor 823 is coupled between node 822 and node 819, and is configured to provide compensation for the circuit loop formed by resistors 814 and 815 coupling a scaled version of reference voltage 824 onto the control terminal of device 807. In various embodiments, a value of capacitor 823 may be determined to prevent oscillation in the circuit loop. Capacitor 823 may, in various embodiments, be implemented using a metal-oxide-metal ("MOM") structure, a metal-insulator-metal ("MIM") structure, or any other suitable capacitor structure available on semiconductor manufacturing process.

Figure 9:
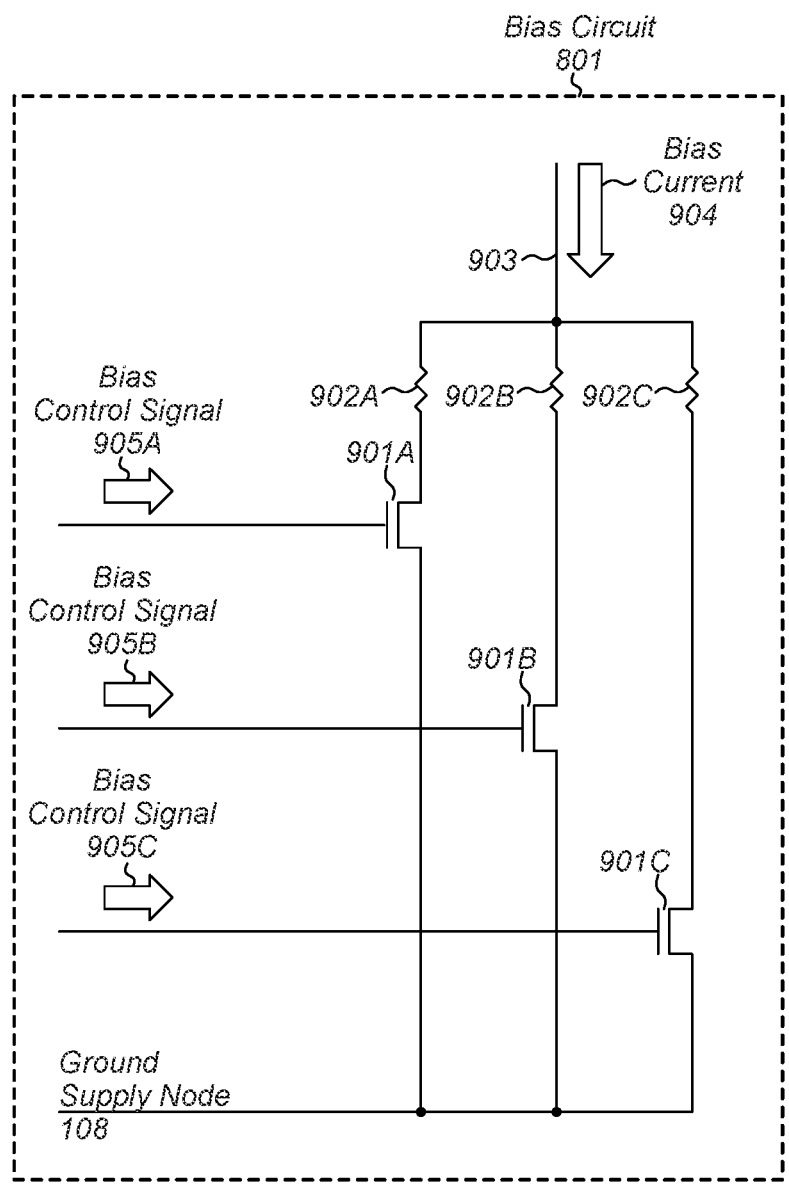
FIG. 9 is a block diagram of an embodiment of a bias current generator circuit.

Turning to FIG. 9, a block diagram of an embodiment of bias circuit 801 is depicted. As illustrated, bias circuit 801 includes devices 901A-901C and resistors 902A-C. It is noted that although only three devices and three resistors are depicted in the embodiment of FIG. 9, in other embodiments, more resistors and devices can be employed to provide additional possible values for bias current 904.

Resistor 902A is coupled between node 903 and device 901A, which is further coupled to ground supply node 108, and is controlled by bias control signal 905A. In a similar fashion, resistors 902B and 902C are coupled between node 903 and devices 901B and 901C, respectively. Devices 901B and 901C are further coupled to ground supply node 108, and are controlled by bias control signals 905B and 905C, respectively.

Device 901A is configured to couple resistor 902A to ground supply node in response to an activation of bias control signal 905A. When resistor 902A is coupled to ground supply node 108, the resultant conduction path from node 903 to ground supply node 108 causes a current to flow from node 903 into ground supply node 108, contributing to bias current 904. In a similar fashion, device 901B is configured to couple resistor 902B to ground supply node 108 in response to an activation of bias control signal 905B, and device 901C is configured to couple resistor 902C to ground supply node 108 in response to an activation of bias control signal 905C. By activating different combinations of bias control signals 905A-905C, different conduction paths between node 903 and ground supply node 108 can be made active, thereby changing the value of bias current 904.

Devices 901A-901C may be implemented as n-channel MOSFETs, FinFETs, GAAFETs, or any other suitable transconductance device. Resistors 902A-902C may be fabricated using polysilicon, metal, or any other suitable material available on a semiconductor manufacturing process. It is noted that the values of resistors 902A-902C may be different. For example, in some embodiments, the values of resistors 902A-902C may be binary weighted, such that the value of resistor 902B is twice that of resistor 902A, and so on.

Figure 10:
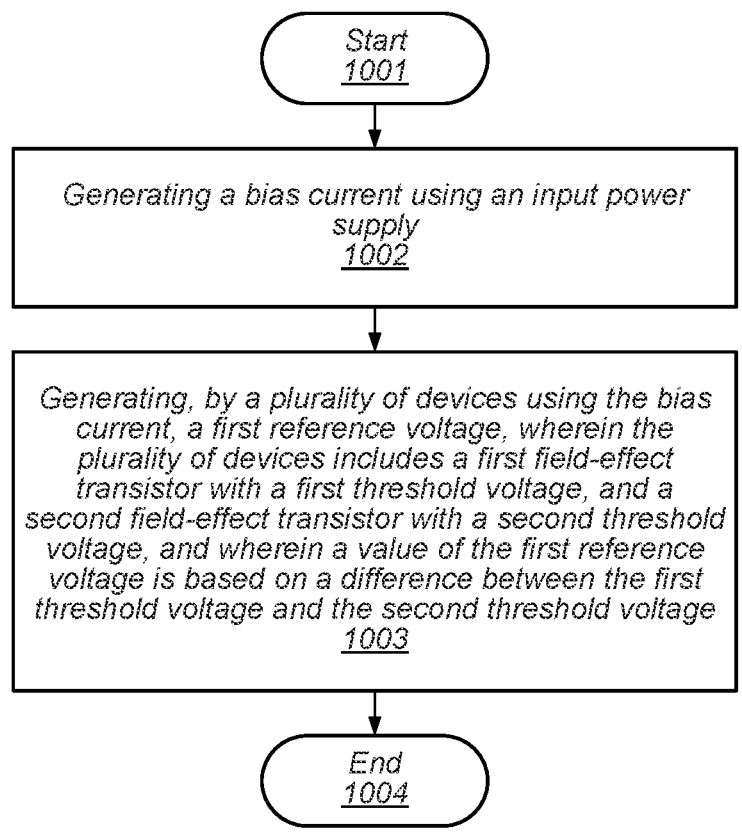
FIG. 10 is a flow diagram of an embodiment of a method for operating a reference generator circuit.

Turning to FIG. 10, a flow diagram depicting an embodiment of a method for generating a reference voltage is illustrated. The method, which may be applied to various reference generator circuits, such as reference generator circuit 100, begins in block 1001.

The method includes generating a bias current using an input power supply (block 1002). In some cases, the method may also include adjusting a value of the bias current using at least one control signal. In various embodiments, such adjustments to the bias current may be made based on a value of the input power supply, type of the devices included in the reference generator circuit, and the like.

The method further includes generating, by a plurality of devices using the bias current, a first reference voltage (block 1003). In various embodiments, the plurality of devices includes a first field-effect transistor with a first threshold voltage, and a second field-effect transistor with a second threshold voltage. In such cases, the value of the first reference voltage is based on a difference between the first threshold voltage and the second threshold voltage.

In some embodiments, a first ratio of a width of the first field-effect transistor to a length of the first field-effect transistor is within a threshold value of a second ratio of a width of the second field-effect transistor and a length of the second field-effect transistor. As described above, when the width-to-length ratios of the two field-effect transistors are the same, any variation of the first reference voltage with temperature can be minimal.

In certain situations, however, it may be desirable for the first reference voltage to have a particular temperature dependence. For example, a circuit that uses the first reference may a have a positive temperature dependence. To counteract the circuit's positive temperature dependence, the first reference voltage may be generated such that it has a negative temperature dependence. In such cases, the method may include modifying a temperature dependence of the first reference voltage by adjusting the first ratio of the width of the first field-effect transistor to the length of the first field-effect transistor.

As described above, multiple delta-threshold circuits may be cascaded together in order to increase the voltage level of a reference voltage. In such cases, the plurality of devices may also include a third field-effect transistor with a third threshold voltage and a fourth field-effect transistor with a fourth threshold voltage, and the method may also further include generating, by the plurality of devices using the bias current and the first reference voltage, a second reference voltage whose value is based on the first reference voltage and a second difference between the third threshold voltage and the fourth threshold voltage.

In some cases, manufacturing variation from one integrated circuit to another can result in slight differences in the value of the first reference voltage across different integrated circuits. Such differences may violate a specified tolerance of the first reference voltage, which could lead to improper operation of circuits that use the first reference voltage. To compensate for such variation, the method may also includes adjusting the value of the first reference voltage to generate a trimmed reference voltage. In various embodiments, adjusting the first reference voltage includes scaling, by a resistive divider circuit, the trimmed reference voltage to create a scaled reference voltage, and combining, by a buffer circuit, the first reference voltage and the scaled reference voltage to create the trimmed reference voltage. The method concludes in block 1004.

Figure 11:
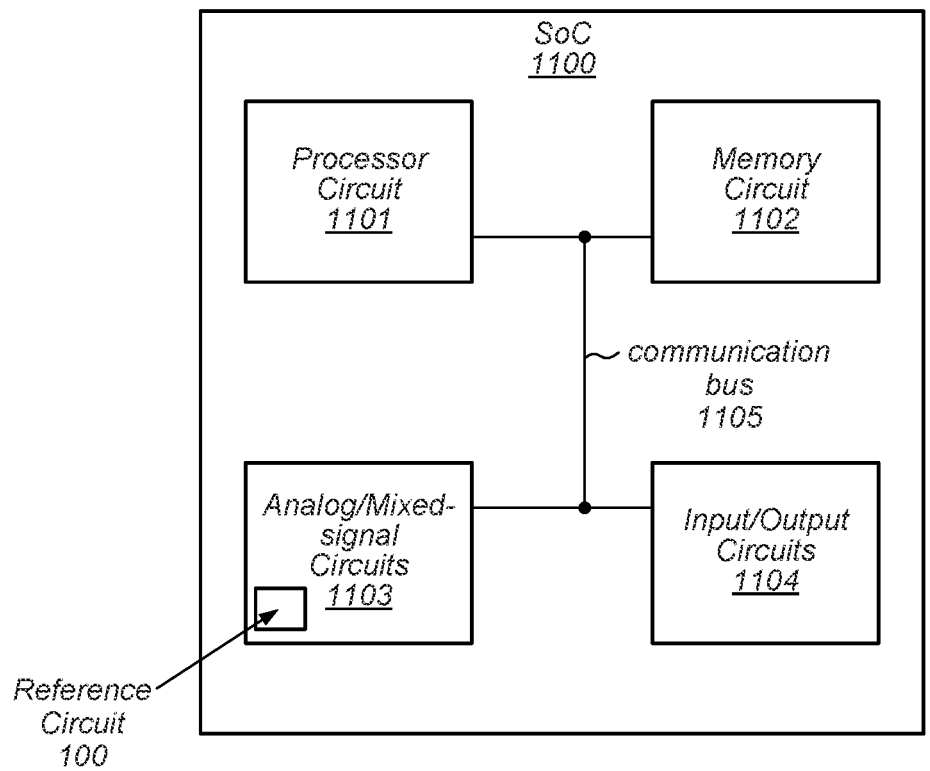
FIG. 11 is a block diagram of one embodiment of a system-on-a-chip that includes a power management circuit.

A block diagram of a system-on-a-chip (SoC) is illustrated in FIG. 11. In the illustrated embodiment, SoC 1100 includes processor circuit 1101, memory circuit 1102, analog/mixed-signal circuits 1103, and input/output circuits 1104, each of which is coupled to communication bus 1105. In various embodiments, SoC 1100 may be configured for use in a desktop computer, server, or in a mobile computing application such as, e.g., a tablet, laptop computer, or wearable computing device.

Processor circuit 1101 may, in various embodiments, be representative of a general-purpose processor that performs computational operations. For example, processor circuit 1101 may be a central processing unit (CPU) such as a microprocessor, a microcontroller, an application-specific integrated circuit (ASIC), or a field-programmable gate array (FPGA).

Memory circuit 1102 may, in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that although a single memory circuit is illustrated in FIG. 11, in other embodiments, any suitable number of memory circuits may be employed.

Analog/mixed-signal circuits 1103 includes one or more reference circuits, such as reference generator circuit 100. Additionally, analog/mixed-signal circuits 1103 may include a crystal oscillator circuit, a phase-locked loop (PLL) circuit, an analog-to-digital converter (ADC) circuit, and a digital-to-analog converter (DAC) circuit (all not shown). In other embodiments, analog/mixed-signal circuits 1103 may be configured to perform power management tasks with the inclusion of on-chip power supplies and voltage regulators.

Input/output circuits 1104 may be configured to coordinate data transfer between SoC 1100 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices.

In some embodiments, input/output circuits 1104 may be configured to implement a version of Universal Serial Bus (USB) protocol or IEEE 1394 (Firewire®) protocol.

Input/output circuits 1104 may also be configured to coordinate data transfer between SoC 1100 and one or more devices (e.g., other computing systems or integrated circuits) coupled to SoC 1100 via a network. In one embodiment, input/output circuits 1104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1104 may be configured to implement multiple discrete network interface ports.

Figure 12:
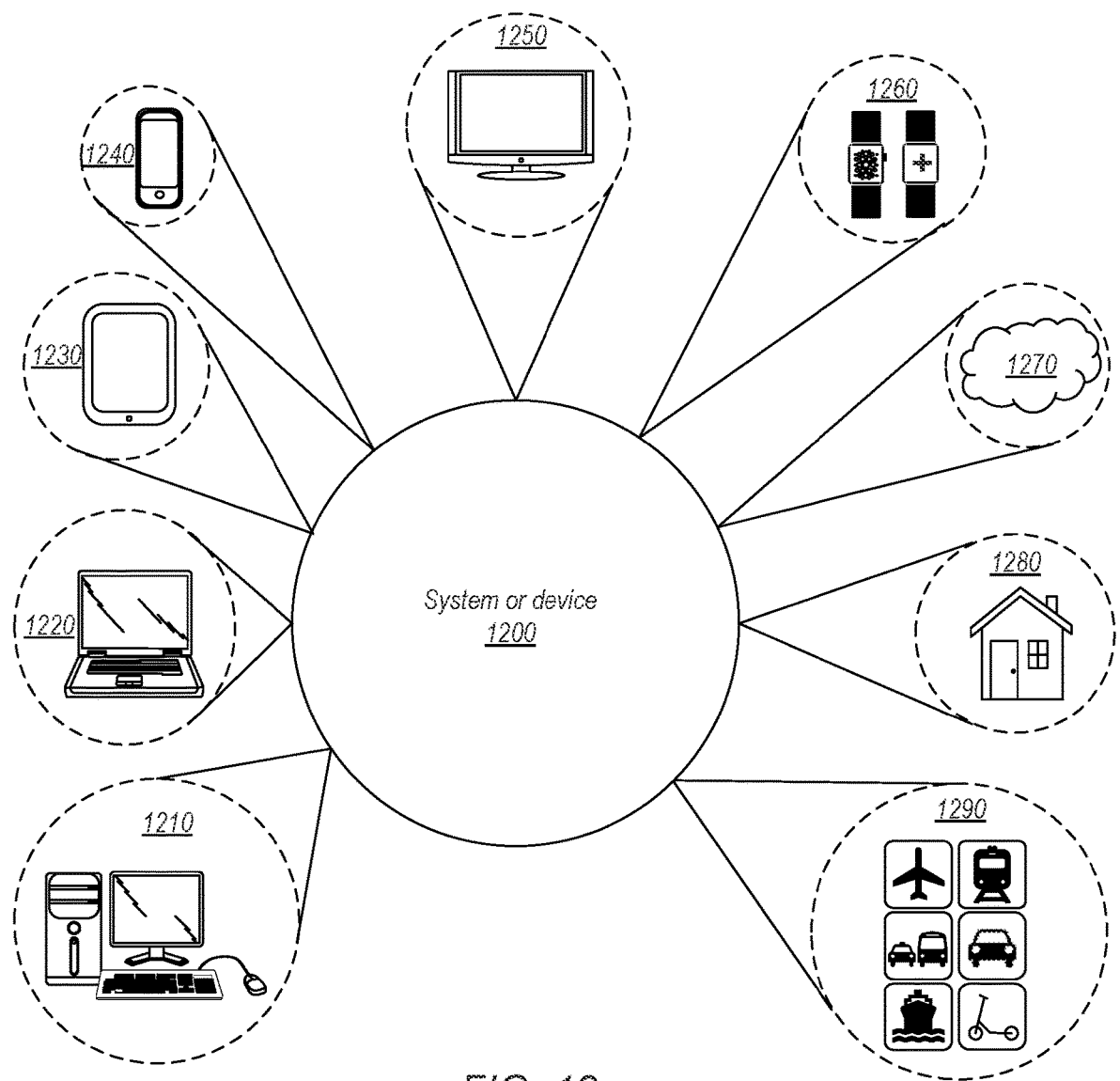
FIG. 12 is a block diagram of various embodiments of computer systems that may include power converter circuits.

Turning now to FIG. 12, various types of systems that may include any of the circuits, devices, or systems discussed above are illustrated. System or device 1200, which may incorporate or otherwise utilize one or more of the techniques described herein, may be utilized in a wide range of areas. For example, system or device 1200 may be utilized as part of the hardware of systems such as a desktop computer 1210, laptop computer 1220, tablet computer 1230, cellular or mobile phone 1240, or television 1250 (or set-top box coupled to a television).

Similarly, disclosed elements may be utilized in a wearable device 1260, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1200 may also be used in various other contexts. For example, system or device 1200 may be utilized in the context of a server computer system, such as a dedicated server or on shared hardware that implements a cloud-based service 1270. Still further, system or device 1200 may be implemented in a wide range of specialized everyday devices, including devices 1280 commonly found in the home such as refrigerators, thermostats, security cameras, etc. The interconnection of such devices is often referred to as the "Internet of Things" (IoT). Elements may also be implemented in various modes of transportation. For example, system or device 1200 could be employed in the control systems, guidance systems, entertainment systems, etc. of various types of vehicles 1290.

The applications illustrated in FIG. 12 are merely exemplary and are not intended to limit the potential future applications of disclosed systems or devices. Other example applications include, without limitation: portable gaming devices, music players, data storage devices, unmanned aerial vehicles, etc.

Figure 13:
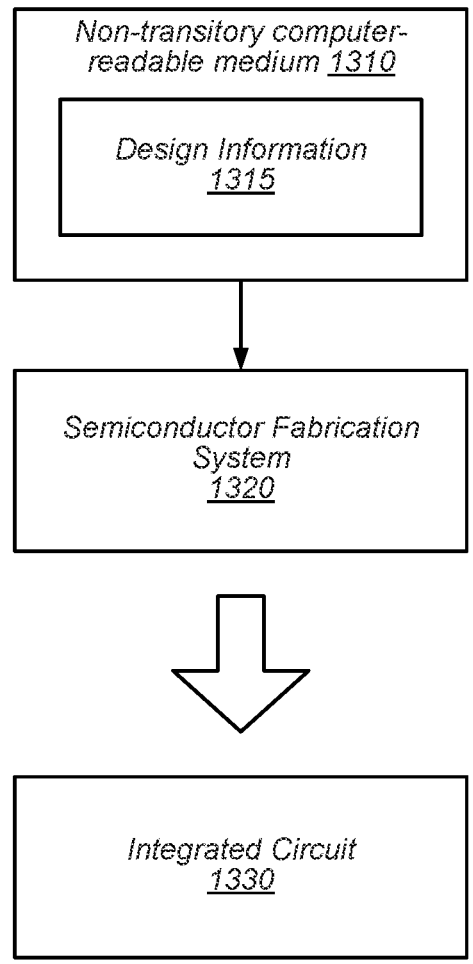
FIG. 13 illustrates an example of a non-transitory computer-readable storage medium that stores circuit design information.

FIG. 13 is a block diagram illustrating an example of a non-transitory computer-readable storage medium that stores circuit design information, according to some embodiments. In the illustrated embodiment, semiconductor fabrication system 1320 is configured to process design information 1315 stored on non-transitory computer-readable storage medium 1310 and fabricate integrated circuit 1330 based on design information 1315.

Non-transitory computer-readable storage medium 1310 may comprise any of various appropriate types of memory devices or storage devices. Non-transitory computer-readable storage medium 1310 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as Flash, magnetic media, e.g., a hard drive, or optical storage; registers, or other similar types of memory elements, etc. Non-transitory computer-readable storage medium 1310 may include other types of non-transitory memory as well or combinations thereof. Non-transitory computer-readable storage medium 1310 may include two or more memory mediums, which may reside in different locations, e.g., in different computer systems that are connected over a network.

Design information 1315 may be specified using any of various appropriate computer languages, including hardware description languages such as, without limitation: VHDL, Verilog, SystemC, SystemVerilog, RHDL, M, MyHDL, etc. Design information 1315 may be usable by semiconductor fabrication system 1320 to fabricate at least a portion of integrated circuit 1330. The format of design information 1315 may be recognized by at least one semiconductor fabrication system, such as semiconductor fabrication system 1320, for example. In some embodiments, design information 1315 may include a netlist that specifies elements of a cell library, as well as their connectivity. One or more cell libraries used during logic synthesis of circuits included in integrated circuit 1330 may also be included in design information 1315. Such cell libraries may include information indicative of device or transistor level netlists, mask design data, characterization data, and the like, of cells included in the cell library.

Integrated circuit 1330 may, in various embodiments, include one or more custom macrocells, such as memories, analog or mixed-signal circuits, and the like. In such cases, design information 1315 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 1320 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1320 may also be configured to perform various testing of fabricated circuits for correct operation.

In various embodiments, integrated circuit 1330 is configured to operate according to a circuit design specified by design information 1315, which may include performing any of the functionality described herein. For example, integrated circuit 1330 may include any of various elements shown or described herein. Further, integrated circuit 1330 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y.

On the other hand, a phrase such as "either x or y, but not both" makes clear that "or" is being used in the exclusive sense.

A recitation of "w, x, y, or z, or any combination thereof" or "at least one of w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
   a current source configured to generate a bias current using an input power supply; and
   a plurality of devices including a first field-effect transistor with a first threshold voltage, and a second field-effect transistor with a second threshold voltage, wherein the plurality of devices are configured to generate, using the bias current, a first reference voltage whose value is based on a first difference between the first threshold voltage and the second threshold voltage
   a buffer circuit configured to generate a trimmed reference voltage using the first reference voltage and a scaled reference voltage; and
   a trim circuit including a resistive divider circuit configured to generate the scaled reference voltage using the trimmed reference voltage.

2. The apparatus of claim 1, wherein a first beta ratio of the first field-effect transistor is the same as a second beta ratio of the second field-effect transistor.

3. The apparatus of claim 2, wherein the plurality of devices is further configured to modify a temperature dependence of the first reference voltage by adjusting the first beta ratio of the first field-effect transistor.

4. The apparatus of claim 1, wherein the plurality of devices further includes a third field-effect transistor with a third threshold voltage and a fourth field-effect transistor with a fourth threshold voltage, and wherein the plurality of devices is further configured to generate, using the bias current and the first reference voltage, a second reference voltage whose value is based on the first reference voltage and a second difference between the third threshold voltage and the fourth threshold voltage.

5. The apparatus of claim 1, wherein the current source is further configured to adjust a value of the bias current based on at least one control signal.

6. The apparatus of claim 1, wherein the trim circuit that includes a plurality of resistors whose respective values are programmable.

7. A method, comprising:
   generating a bias current using an input power supply; and
   generating, by a plurality of devices using the bias current, a first reference voltage, wherein the plurality of devices includes a first field-effect transistor with a first threshold voltage, and a second field-effect transistor with a second threshold voltage, and wherein a value of the first reference voltage is based on a difference between the first threshold voltage and the second threshold voltage; and
   adjusting the value of the first reference voltage to generate a trimmed reference voltage, wherein the adjusting comprises:
      scaling, by a resistive divider circuit, the trimmed reference voltage to create a scaled reference voltage; and
      combining, by a buffer circuit, the first reference voltage and the scaled reference voltage to create the trimmed reference voltage.

8. The method of claim 7, wherein a first beta ratio of the first field-effect transistor is the same as a second beta ratio of the second field-effect transistor.

9. The method of claim 8, further comprising, modifying a temperature dependence of the first reference voltage by adjusting the first beta ratio of the first field-effect transistor.

10. The method of claim 7, wherein the plurality of devices further includes a third field-effect transistor with a third threshold voltage and a fourth field-effect transistor with a fourth threshold voltage, and further comprising, generating, by the plurality of devices using the bias current and the first reference voltage, a second reference voltage whose value is based on the first reference voltage and a second difference between the third threshold voltage and the fourth threshold voltage.

11. The method of claim 7, further comprising, adjusting a value of the bias current using at least one control signal.

12. The apparatus of claim 6, wherein the trim circuit is configured to adjust respective values of ones of the plurality of resistors using trim control signals.

13. The apparatus of claim 1, further comprising a bias circuit configured to sink the bias current.

14. A system comprising:
   a current source configured to generate a bias current using an input power supply; and
   a reference voltage circuit configured to generate a first reference voltage, wherein the reference voltage circuit includes a plurality of devices including a first field-effect transistor with a first threshold voltage, and a second field-effect transistor with a second threshold voltage, wherein the plurality of devices are configured to generate, using the bias current, the first reference voltage, wherein a value of the first reference voltage is based on a first difference between the first threshold voltage and the second threshold voltage;
   a buffer circuit configured to generate a trimmed reference voltage using the first reference voltage and a scaled reference voltage; and
   a trim circuit including a resistive divider circuit configured to generate the scaled reference voltage using the trimmed reference voltage; and
   a bias circuit configured to sink the bias current.

15. The system of claim 14, wherein the bias circuit is configured to adjust the bias current using a plurality of bias control signals.

16. The system of claim 15, wherein the bias circuit includes a plurality of signal paths, wherein ones of the plurality of signal paths includes a resistor coupled in series with a transconductance device.

17. The system of claim 14, wherein a first beta ratio of the first field-effect transistor is the same as a second beta ratio of the second field-effect transistor.

18. The system of claim 17, wherein ones of the plurality of devices are further configured to modify a temperature dependence of the first reference voltage by adjusting the first beta ratio of the first field-effect transistor.

19. The system of claim 14, wherein the plurality of devices further includes a third field-effect transistor with a third threshold voltage and a fourth field-effect transistor with a fourth threshold voltage, and wherein the plurality of devices is further configured to generate, using the bias current and the first reference voltage, a second reference voltage whose value is based on the first reference voltage and a second difference between the third threshold voltage and the fourth threshold voltage.

20. The system of claim 14, wherein the trim circuit that includes a plurality of resistors whose respective values are programmable.

* * * * *